(12) United States Patent
Batra et al.

(10) Patent No.: US 11,742,174 B2
(45) Date of Patent: Aug. 29, 2023

(54) TRANSFERRABLE SAMPLE PLATFORM CONTAINING AN EXFOLIATED GRAPHENE MEMBRANE FOR THE ANALYSIS AND PROCESSING OF NANOMATERIALS

(71) Applicant: KING ABDULLAH UNIVERSITY OF SCIENCE AND TECHNOLOGY, Thuwal (SA)

(72) Inventors: Nitinkumar M. Batra, Thuwal (SA); Pedro Miguel Costa, Thuwal (SA); Dinesh Mahalingam, Thuwal (SA); Suzana P. Nunes, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 132 days.

(21) Appl. No.: 17/601,736

(22) PCT Filed: Feb. 20, 2020

(86) PCT No.: PCT/IB2020/051439
§ 371 (c)(1),
(2) Date: Oct. 6, 2021

(87) PCT Pub. No.: WO2020/208433
PCT Pub. Date: Oct. 15, 2020

(65) Prior Publication Data
US 2022/0199357 A1     Jun. 23, 2022

Related U.S. Application Data

(60) Provisional application No. 62/906,292, filed on Sep. 26, 2019, provisional application No. 62/831,480, filed on Apr. 9, 2019.

(51) Int. Cl.
*H01J 37/20*     (2006.01)
*H01J 37/26*     (2006.01)

(52) U.S. Cl.
CPC ............... *H01J 37/20* (2013.01); *H01J 37/26* (2013.01)

(58) Field of Classification Search
CPC ........ H01J 37/20; H01J 37/26; H01J 2237/20; H01J 2237/2007
See application file for complete search history.

(56) References Cited

U.S. PATENT DOCUMENTS 10,392,248 B2 * 8/2019 Lock ...................... B82Y 40/00
2013/0146221 A1 * 6/2013 Kolmakov .............. H01J 37/20
                                                                156/252

(Continued)

FOREIGN PATENT DOCUMENTS

EP         3050620 A1     8/2016
WO      2018234930 A1   12/2018

OTHER PUBLICATIONS

International Search Report in corresponding/related International Application No. PCT/IB2020/051439, dated Jun. 9, 2020.

(Continued)

*Primary Examiner* — David A Vanore
(74) *Attorney, Agent, or Firm* — Patent Portfolio Builders PLLC

(57) ABSTRACT

A multipurpose and transferrable sample platform for supporting, analyzing and/or processing a target material. The platform includes a substrate; a dielectric layer formed over a face of the substrate; electrodes formed over the dielectric layer; a slot formed through the substrate and the dielectric layer; and an exfoliated graphene-based membrane placed over the slot and in electrical contact with the electrodes. The exfoliated graphene-based membrane is configured to support, or act upon, a study material or chemical precursors.

20 Claims, 13 Drawing Sheets

(56) References Cited

U.S. PATENT DOCUMENTS

2015/0303059 A1* 10/2015 Friedman .......... H01L 21/02227
                                                  257/29
2018/0108510 A1*  4/2018 Glaeser ................... H01J 37/26
2022/0199357 A1*  6/2022 Batra ....................... H01J 37/20

OTHER PUBLICATIONS

Pantelic, R.S., et al., "Graphene Oxide: A Substrate for Optimizing Preparations of Frozen-Hydrated Samples," Journal of Structural Biology, Dec. 24, 2009, vol. 170, pp. 152-156, Elsevier Inc.
Passmore, L.A., et al., "Specimen Preparation for High-Resolution Cryo-EM," The Resolution Revolution: Recent Advances in CryoEM, Chapter three, Jan. 1, 2016, vol. 579, pp. 51-86, Elsevier Inc.
Wilson, N.R., et al., "Graphene Oxide: Structural Analysis and Application as a Highly Transparent Support for Electron Microscopy," ACS Nano, Aug. 18, 2009, vol. 3, No. 9, pp. 2547-2556.
Written Opinion of the International Searching Authority in corresponding/related International Application No. PCT/IB2020/051439, dated Jun. 9, 2020.

* cited by examiner

TRANSFERRABLE SAMPLE PLATFORM CONTAINING AN EXFOLIATED GRAPHENE MEMBRANE FOR THE ANALYSIS AND PROCESSING OF NANOMATERIALS

CROSS-REFERENCE TO RELATED APPLICATIONS

This application is a U.S. National Stage Application of International Application No. PCT/2020/051439, filed on Feb. 10, 2020, which claims priority to U.S. Provisional Patent Application No. 62/831,480, filed on Apr. 9, 2019, entitled "GRAPHENE OXIDE FLAKES FOR IN-SITU TEM," and U.S. Provisional Patent Application No. 62/906,292, filed on Sep. 26, 2019, entitled "A TRANSFERRABLE SAMPLE PLATFORM CONTAINING AN EXFOLIATED GRAPHENE MEMBRANE FOR THE ANALYSIS AND PROCESSING OF NANOMATERIALS," the disclosures of which are incorporated herein by reference in their entirety.

BACKGROUND

Technical Field

Embodiments of the subject matter disclosed herein generally relate to a platform that works with, and may be transferred between, different investigating apparatus(es), and more specifically, to a membrane composed of exfoliated graphene that is formed or placed over a perforated patterned platform that can be used to support, study and/or modify samples of nanomaterials and can be either integrated in a sample holder or placed on its own in the investigating apparatus.

Discussion of the Background

For decades, as the fields of nanoscience and nanotechnology matured, materials synthesis and device fabrication processes evolved. Alongside, characterization tools such as transmission electron microscopes (TEM) made large strides in assisting the study of particles that are just a few billionth parts of a meter in size.

While a large number of nanomaterials have been reported, their technological integration is dependent on knowing the structure-property relation as these are not necessarily straightforward at the nanoscale level. Various investigating spectroscopical and microscopical tools (X-ray photoelectron spectrometers, electron microscopes, light microscopes, Raman microscopes, scanning probe microscopes, etc.), called herein investigating tools, are currently used to characterize samples of nanomaterials (quantum dots, nanoparticles, nanowires, nanotubes, nanosheets, etc.). These investigating tools provide complementary information on the objects of study and are commonly used in a separate and sequential way. Rarely does one have the possibility to undertake these studies in a correlated way or as a fully integrated assessment flow.

Over the past decade, a common design has dominated the fabrication of the sample platform, which is now discussed in the context of a TEM. The TEM is composed of several sections amongst which is the column where the electromagnetic lenses—that guide and focus the imaging electrons—are located. Its sample holder 100 is shown in FIG. 1, which is a seamless assembly of several machined parts. The sample holder 100 is placed in position for analysis through a hole transversal to the main axis of the column.

One of the parts of the sample holder 100 is a long rod-shaped section 102 that terminates in a thinner flat section 104 where the sample material or sample support for the material is placed.

There are some types of materials such as metal alloys that can be thinned down and cut into shape to be directly loaded to the flat section 104. However, for nanomaterials, a sample platform is required. This sample platform can be a metal grid, as mentioned before, or a diced sample platform 200, as shown in FIG. 2. The latter is a fairly recent type of sample platform and it can be designed in many different ways to fit into the flat section 104 of the sample holder 100. Both TEM sample holder and sample platform are fabricated from non-magnetic materials to avoid any interference with the electron beam and microscope lens.

In essence, and while they may serve different purposes (e.g., heating, electrical probing, etc.), they all rely on an electron-transparent membrane 202 to sustain the nanomaterials to be studied. This membrane is made of a thin layer of silicon nitride or silicon dioxide, its thickness ranging from some nanometers to a few micrometers. Generally, the sample platforms are consumable parts with an overall size of 15 to 80 mm$^2$ and sample loading areas of 400 to 2500 μm$^2$. Their fabrication results from a complex combination of clean room techniques, which includes lithography, wet etching and metal deposition processes, as described, for example, in U.S. Patent Application Publication 2008/0280099/A1 and U.S. Pat. Nos. 7,482,587/B1, 8,853,646/B2, 8,872,129/B2, and 9,040,939/B2.

In various implementations of the sample platform 200, the platforms are designed and fabricated with the intent of probing the electrical response of the nanomaterials 204 under study. In these cases, the aforementioned membrane 202 not only supports the sample material 204, but can also serve to sustain and stabilize the electrodes to which the component particles of the sample will be contacted to. The electrodes 300 are thin lines of deposited metal that terminate in pads 302, as shown in FIG. 3. Metal wires, running through the inside of the rod-shaped section 102, are arranged in such a way that they selectively connect to each one of the pads 302. The number of the electrodes 300 can differ from two to six or more and have different shapes and/or lengths (see, for example, U.S. Pat. No. 8,872,129/B2).

Besides the role of support, the membrane 202 needs to be transparent to the electron beam (for imaging purposes) and electrically insulating (for functional purposes, e.g., localized heating, flow of current, etc.). Given that the membrane 202 is very thin and made of brittle materials, a common problem is that, if the membrane 202 breaks, then the entire sample platform 200 becomes unusable. Further, even if the membrane 202 does not break, the sample platforms 200 are non-reusable, which is an increased cost factor for users.

Given that the membrane 202 is made of silicon nitride or silicon dioxide, both of which being dielectric materials, the electrical probing experiments performed inside a TEM may be influenced by the charging of the membrane. The imaging beam of the TEM is composed of charged particles (electrons) that, upon interaction with the dielectric membrane 202, may originate relatively strong electrostatic fields around the sample.

This common design of the conventional platforms implies that, invariably, a thin Si-based membrane (generally, silicon nitride or dioxide with a thickness of <100 nm to ensure electron transparency) is included to support the materials and the electrodes necessary to perform the analyses. However, the presence of this membrane brings in drawbacks such as mechanical fragility of the platform (e.g., a stronger push to the membrane will break it, sometimes surface tension of the solvents is enough to do so while drying the membrane) or limited maximum temperature of use (at about 1,200° C., beyond this point the Si-based membranes become structurally unstable and quickly degrade). Other known limitations derived from the presence of a membrane are: reduction of image contrast, fatigue upon experimental cycling, and image drift due to thermally induced expansion/buckling of the membrane.

In regards to correlative assessments of the same object of study, the current technology is also limited. Generally, each investigating tool requires different ways to prepare the object of study for examination or has different types of sample holders. An example is the TEM discussed above. Its sample holders cannot be used for any other purpose or in any other investigating tool. While the sample may be mounted on support grids (which are then mounted in the sample holder), the grids are generally made from thin metal foils, which means that these can hardly be used to sustain chemical processing steps on the sample or allow, for instance, electrical probing of a discrete nanoparticle.

Hence, it is desirable that novel, transferrable, platforms are created where processing and probing of the same nanoparticle can be carried out and that, furthermore, can be transferred between different investigating apparatuses.

SUMMARY

According to an embodiment, there is a multipurpose and transferrable sample platform for supporting, analyzing and/or processing a target material, and the platform includes a substrate, a dielectric layer formed over a face of the substrate, electrodes formed over the dielectric layer, a slot formed through the substrate and the dielectric layer, and an exfoliated graphene-based membrane placed over the slot and in electrical contact with the electrodes. The exfoliated graphene-based membrane is configured to support, or act upon, a study material or chemical precursors.

According to another embodiment, there is a method of adding an exfoliated graphene-based membrane to a multipurpose and transferrable sample platform for an investigating apparatus for supporting, analyzing and/or processing a target material. The method includes providing a substrate that has a through slot; and drop-casting a liquid containing exfoliated graphene flakes over the slot to form the exfoliated graphene-based membrane. The exfoliated graphene-based membrane is in electrical contact with at least one electrode.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a sample platform to which an exfoliated graphene based membrane is added and that can hold a target material or substances for analysis and/or processing. Here, a transmission electron microscope (TEM) is the investigating apparatus employed to exemplify how to use the platform. However, the embodiments discussed herein are not limited to TEM systems, but may be applied to any investigating tool that uses a sample platform for holding a target material.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

In the following, the design of a graphene-membrane platform to produce, analyze, and process nanomaterials is discussed. This sample platform can be designed to be mounted in different investigating tools, such as in the sample holder of a TEM, which is an apparatus that enables the study at, or near, atomic resolution of materials with dimensions ranging from a few micrometers down to some nanometers. The sample platform can be designed and manufactured to have the capability of applying various types of one or more stimuli to a material, either directly or via a sample support, as discussed later.

Figure 4A:
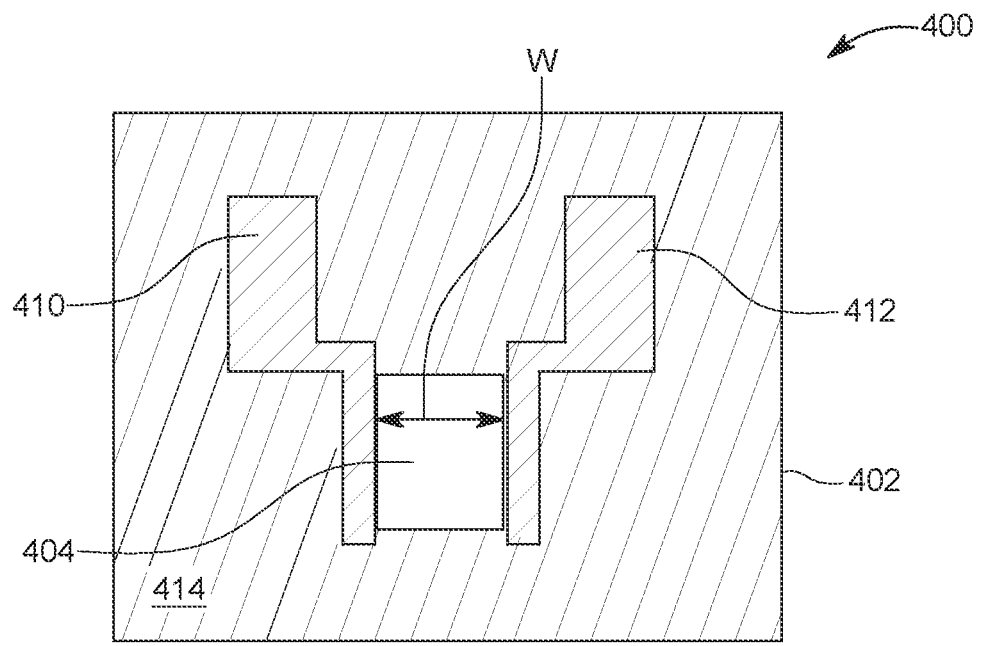
FIGS. 4A and 4B illustrate a diced sample platform that is membraneless.
Figure 4B:
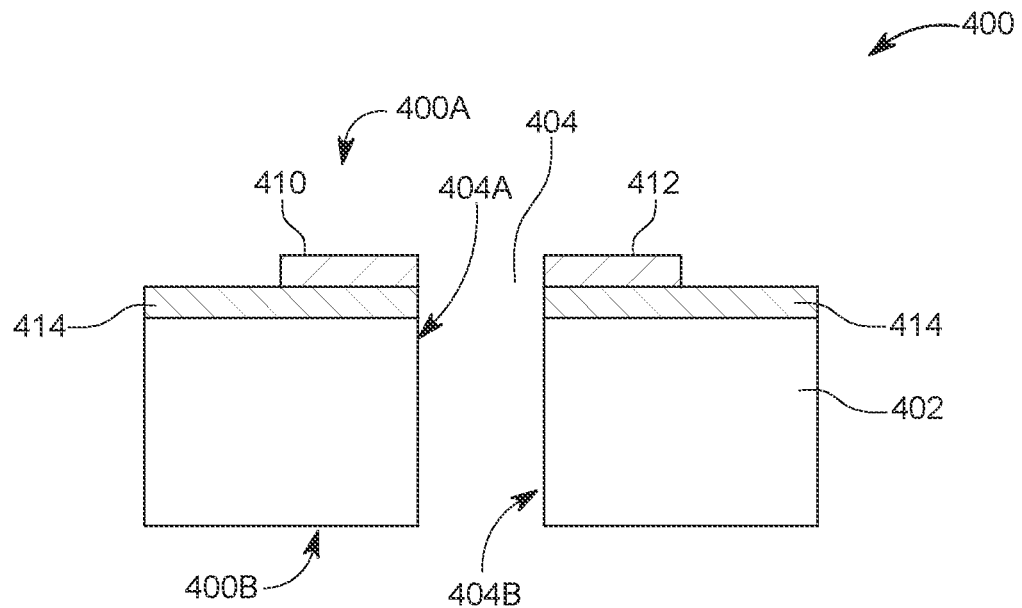

The International Patent Publication WO2018/234930, which is assigned to the assignee of this application, the entire content of which is incorporated herein by reference, describes a sample platform 400, as shown in FIGS. 4A and 4B, which includes a diced wafer piece 402 (also called a substrate) having a window (hereafter, also referred to as an opening, slot, or trench) 404 with a width W. On two opposite sides 404A and 404B of the trench 404 are formed two electrodes 410 and 412. Note that the electrodes may have any shape. The electrodes 410 and 412 may be deposited on top of a dielectric layer 414, which may be formed directly on top of the diced wafer piece 402. The dielectric layer 414 can be made of silicon dioxide or silicon nitride. The diced piece 402 may be made from a silicon wafer and the electrodes 410 and 412 may include gold and/or platinum. Those skilled in the art will understand that other materials with similar properties may be used for all these elements.

Figure 1:
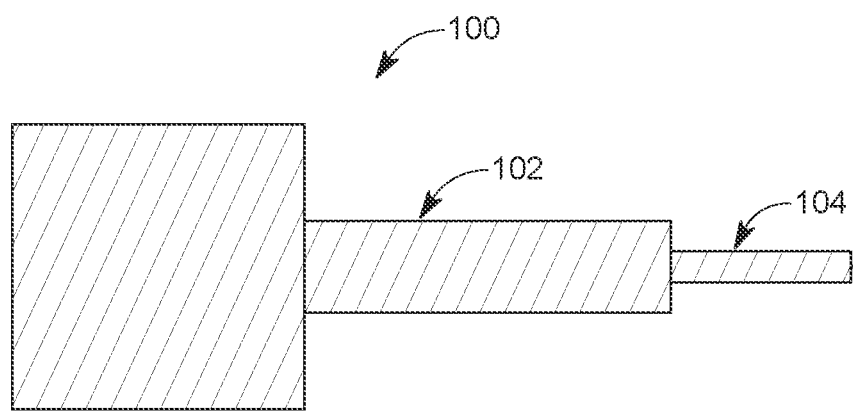
FIG. 1 illustrates a traditional sample holder for a TEM microscope.
Figure 2:
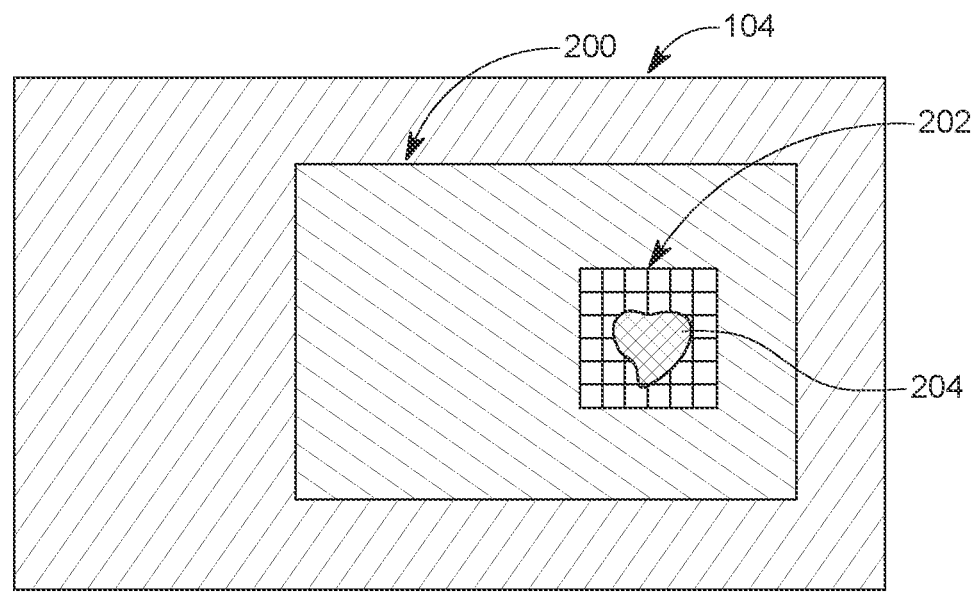
FIG. 2 illustrates a flat section of a TEM sample holder, including a sample platform and a membrane.
Figure 3:
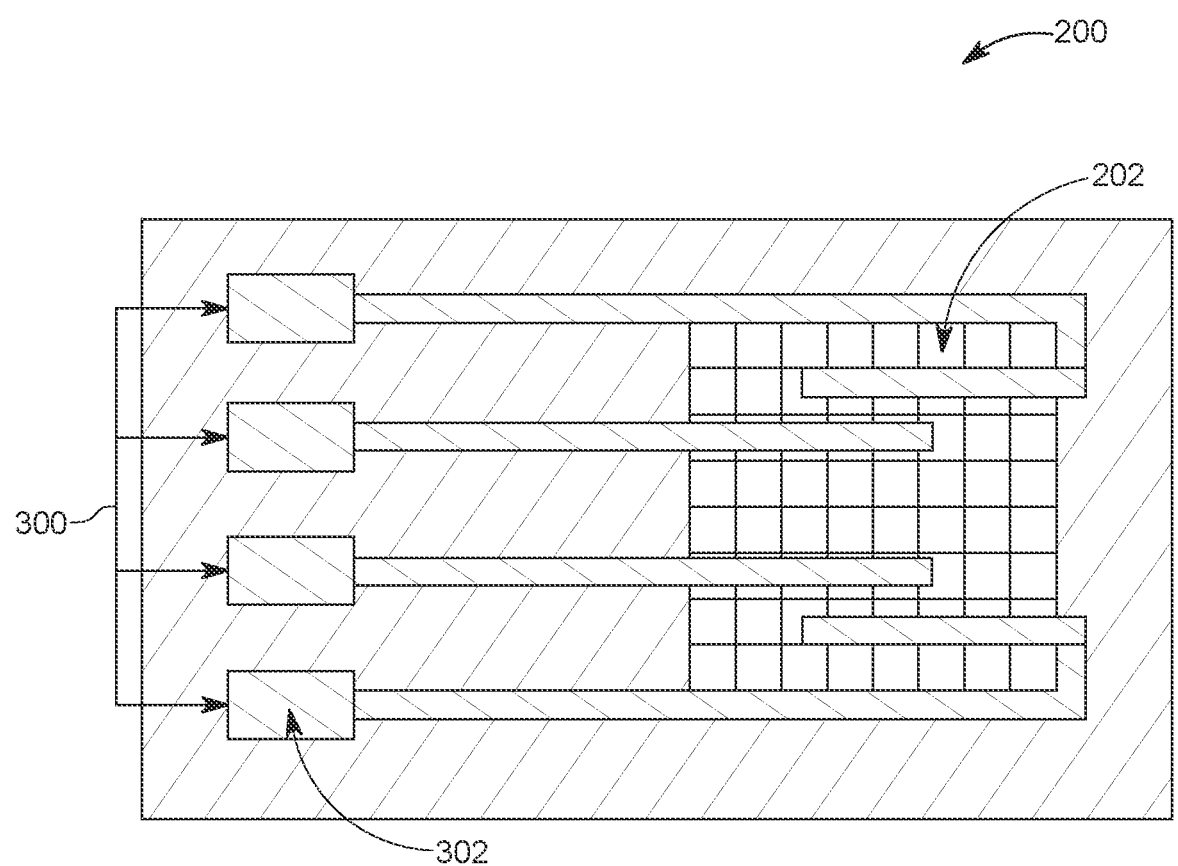
FIG. 3 schematically illustrates a membrane-based sample platform designed for electrical probing of nanomaterials and having four independent electrodes.

FIGS. 4A and 4B show that there is no layer or membrane or any other element formed to cover the trench 404, i.e., there is a free passage from one side 400A of the platform 400 to the opposite side 400B. The sample platform 400 is configured to allow the correlative analysis of nanomaterials. This sample support represents a deviation from the traditional diced platform 200 shown in FIGS. 2 and 3, itself the result of a complex combination of clean room techniques which includes lithography, dry/wet etching, and metal deposition processes. In contrast to the traditional platforms, the platform 400 does not use a patterned and electron-transparent membrane, made of silicon nitride or silicon dioxide, to sustain the nanomaterials to be studied. Instead, through-holes or trenches 404 perforating the platform 400 are used to suspend, between the holes/trench edges, the object of interest. The lack of the membrane over the trench 404 makes the platform 400 more robust and re-usable, effectively circumventing a number of shortcomings of the traditional platform technology. However, the absence of the membrane also introduces some limitations. In particular, the dimension of the particles to be studied in the platform 400 has to be equal to or larger than the dimension of the trench 404, as otherwise it cannot be suspended and will fall through the diced platform.

Figure 5:
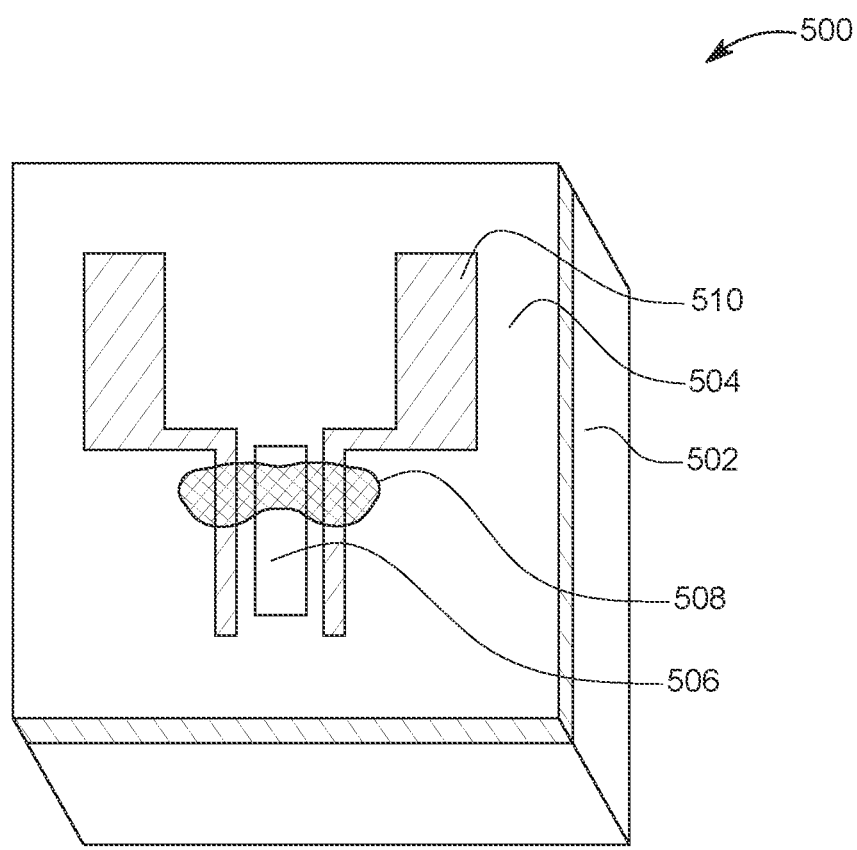
FIG. 5 shows a sample platform over which a graphene-based membrane has been deposited.

The size-limitation mentioned above is solved in the embodiment illustrated in FIG. 5. A membrane 508 is integrated in the platform 500 and, contrarily to other designs, it is not composed of silicon nitride or silicon dioxide. In fact, the membrane 508 is a discrete planar graphene particle that can be formed or placed across the hole/trenches 506 of the platform 500. Note that the present process relies on exfoliated graphene flakes and is, therefore, a very different approach from transferring a graphene layer such as the ones grown by chemical vapor deposition (CVD). In fact, the transfer process of a CVD-grown graphene layer is not compatible with the requirement of high-throughput membrane placement for mass production of this type of platforms. In this sense, the present embodiment constitutes an evolved design of the previous platform 400 as the integration of the exfoliated graphene membrane requires a number of additional fabrication steps to those described in the patent publication WO2018/234930.

The sample platform 500 of FIG. 5 may be made from a diced Si wafer piece 502. A silicon dioxide or silicon nitride layer 504 is formed on the top face of the diced Si wafer piece 502. A through-hole (or slot or trench) 506 is cut into the Si wafer 502, where the electron beam of the TEM device will pass by. The graphene membrane 508 is formed over the slot 506 so to be in direct contact with the electrical contacts (or electrodes) 510, which may be made of Au, Pt or any other commonly used metal in circuit manufacturing. The electrical contacts 510 are formed to sandwich the slot 506.

As the graphene membrane 508 is contacted to the metal electrodes 510, an electrical current can be passed through it to induce resistive heating (i.e., Joule heating). Consequently, the membrane 508 becomes a heating plate acting on whatever object(s) is placed on it (e.g., nanoparticles). In a controlled atmosphere environment, such as in vacuum or an inert gas, the graphene membrane can be heated up to the point of disintegration of the carbon lattice, which is known to be in excess of 3,000° C. Currently, other related membranes (e.g., silicon nitride, see above) are limited to less than half of this temperature.

Besides the function of a heating plate, and given the inert nature of a pristine hexagonal carbon lattice of the graphene, the exfoliated graphene membrane 508 can also act as an inert substrate (or support) for reactions (e.g., chemical reactions) to take place. If chemically modified, the graphene membrane can have a tailored dual role of reactant-support resembling, for instance, some substrates used in heterogeneous catalysis.

From the above, the platform 500 containing the graphene membrane 508 serves a different purpose from that described in the patent publication WO2018/234930. Besides having a "heating plate" function, it can also act as a reaction vessel/substrate. On the other hand, it cannot function as a tool to measure the electrical properties of the object of study. Unlike the platform 400, it is not possible to connect directly the objects of study (e.g., nanoparticles) to the electrodes 510. In this sense, the present platform 500 introduces novel capabilities while losing others, this despite being built upon the diced platform design 400.

As described, the sample platform 500 (or simply the "platform") integrates an exfoliated graphene membrane. It should be noted that, throughout this disclosure, the term "exfoliated graphene" refers to a flake originating from the chemical exfoliation, in a liquid or any other medium, of graphite or processed graphite. In this sense, the term "exfoliated graphene" or simply "graphene" is understood to include the commonly used denominations for carbonaceous flakes: graphene (or thin graphite; where, hereafter and unless otherwise specified, the term "thin" refers to a thickness of <1 μm), graphene oxide (or thin graphite oxide; in both cases, shortened to GO), reduced graphene oxide (or thin reduced graphite oxide; RGO) or any derivations from these types resulting from processing steps (physical or chemical).

The exfoliated graphene membrane, if originating from oxidized graphite/graphene, may be processed to alter its electrical response and remove some (or all) of the oxygen-containing moieties (and/or other non-carbon elements), defects or impurities, so that the electrical behavior of the membrane becomes similar to that of a resistor. After usage, the membrane may be processed to clean its surface and be re-used. If a new membrane is required (e.g., the one used is too contaminated or damaged beyond repair), it is possible to remove the used membrane and load another one in its place, on the same supporting platform 500.

The exfoliated graphene membranes are not expensive to produce and can be added without complicated methodologies to the sample platform. The exfoliated graphene membrane is temperature resistant, being able to maintain its structural integrity, in vacuum or inert atmosphere, up to a temperature of around 3,000° C. For electron microscopy applications, the membrane may be manufactured to be transparent to the electron beam (i.e., with a thickness of <100 nm). The membrane can have varied lateral dimensions and shapes. These can be the result of the graphene flake selected (i.e., as-landed on the diced Si) or from processing steps such as sculpting with an electron beam. The exfoliated graphene membrane provides good support for the objects of interest, does not charge (i.e., does not accumulate electrostatic charges), it is easy to clean/replace, and allows processing of supported substances—inside and outside of the investigating tool—when integrated in the platform. In one embodiment, its reduced thickness, superior stability, and low background image contrast, enables high resolution dynamical studies of nanoparticles inside a TEM, as discussed later.

Figure 6:
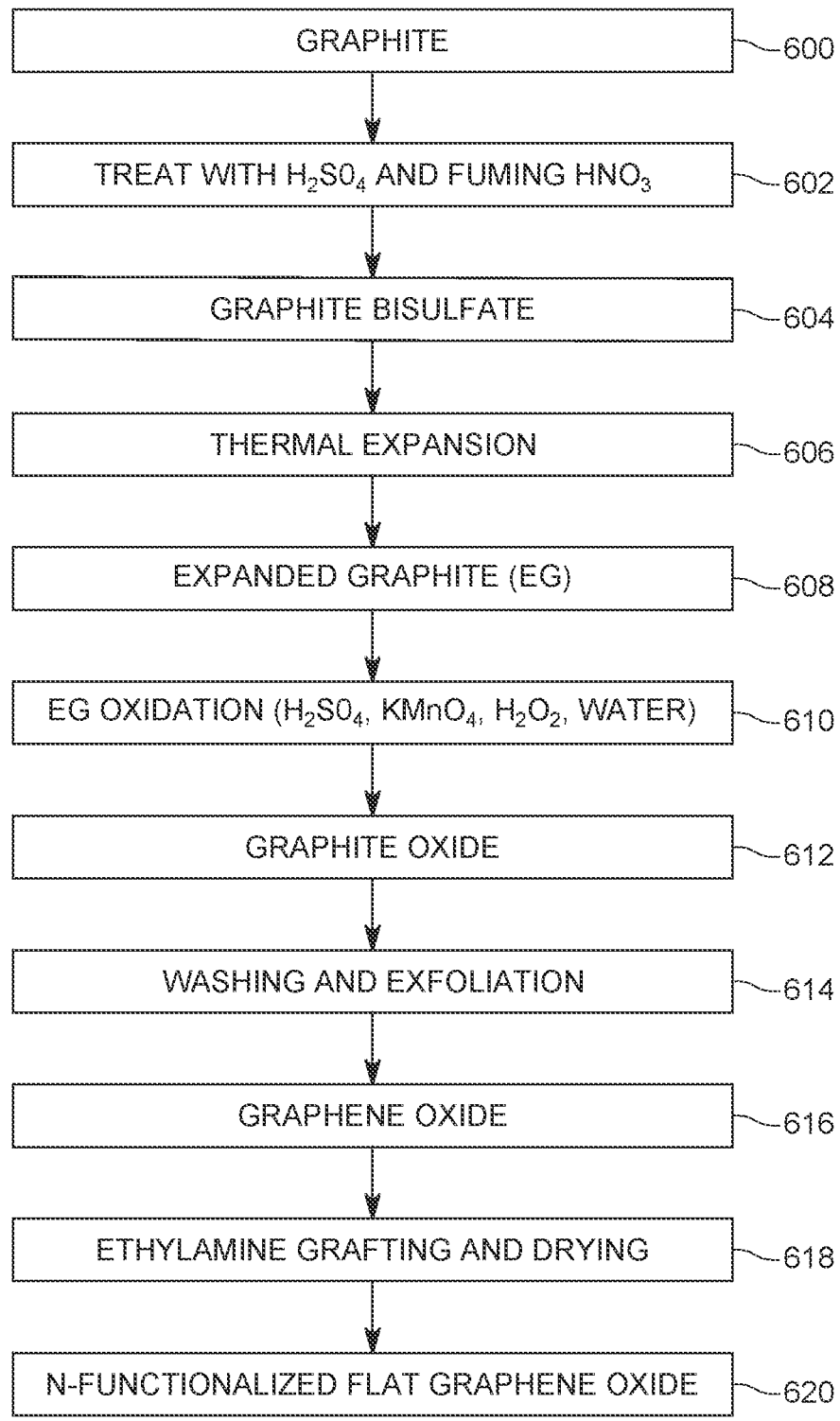
FIG. 6 is a flowchart of a general method to produce exfoliated graphene oxide flakes that are thin, flat and smooth, followed by their processing to yield a chemically-customized surface.

An example of a method to produce flat and thin exfoliated graphene flakes is now discussed with regard to FIG. 6. Those skilled in the art will recognize that other methods may be pursued that result in the production of exfoliated graphene flakes. Dry graphite flakes 600 were procured and poured into a round-bottom flask. Concentrated sulfuric acid was added in step 602 to the dry graphite flakes 600. This was followed by mixing for a few hours. Then, concentrated nitric acid was added and the mixture was stirred, without interruption, for 1 day (step 602). The product was washed thoroughly with deionized water, centrifuged and finally dried, at 60° C., to obtain a powdered graphite intercalated compound in step 604. This powder was thermally expanded in step 606, at 1050° C. for 15 seconds, to obtain the expanded graphite in step 608. Herein, this expanded graphite was used as the precursor to prepare graphene oxide. 1 g of the expanded graphite was mixed with sulfuric acid in step 610, in a three-necked round-bottom flask and stirred well. Thereafter, upon placing the flask in an ice bath, 10 g of $KMnO_4$ were added slowly into the mixture. The entire compound was stirred for 1 day to completely oxidize the expanded graphite. Next, 200 mL of deionized water and 50 mL of $H_2O_2$ were poured slowly into the mixture, noting a color change to yellowish brown, thus forming in step 612, the graphite oxide. The obtained mixture was washed and centrifuged multiple times, in step 614, with an increasingly diluted HCl solution until the pH of the suspension became greater than 5. The resultant GO suspension was exfoliated and diluted in step 616 by gentle shaking, i.e., without subjecting it to ultrasonication, and until the product contained flat and thin GO flakes 700 (see FIGS. 7A to 7D) that could be loaded directly to the membraneless platform 400. For simplicity, these were the flakes used as a demonstration material for the membrane described in the present disclosure. A person skilled in the art will recognize that other exfoliated graphene flakes could be employed for the same purpose.

Figure 7A:
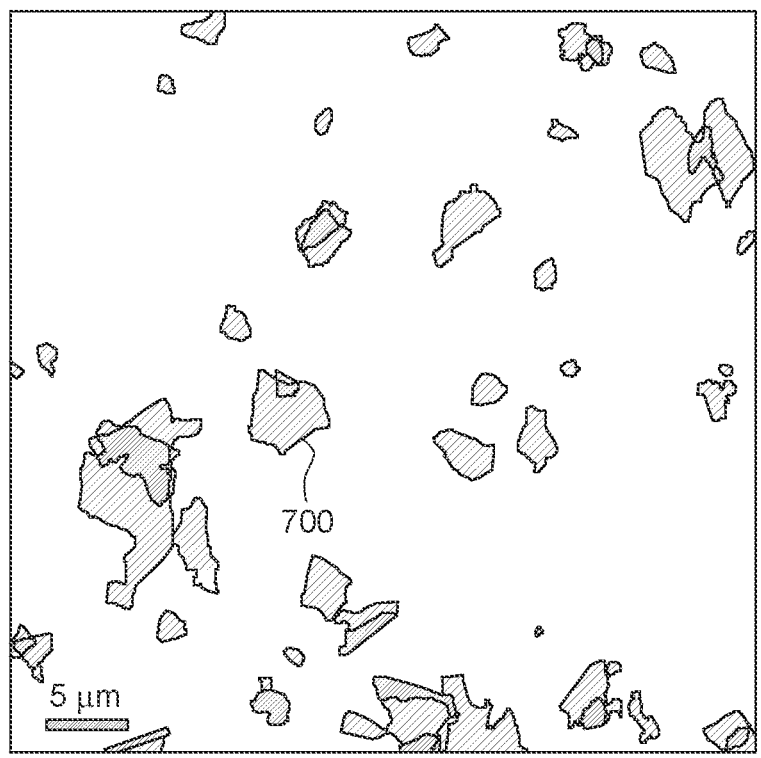
FIGS. 7A to 7D illustrate graphene flakes that make up the graphene-based membrane and their corresponding sizes.
Figure 7B:
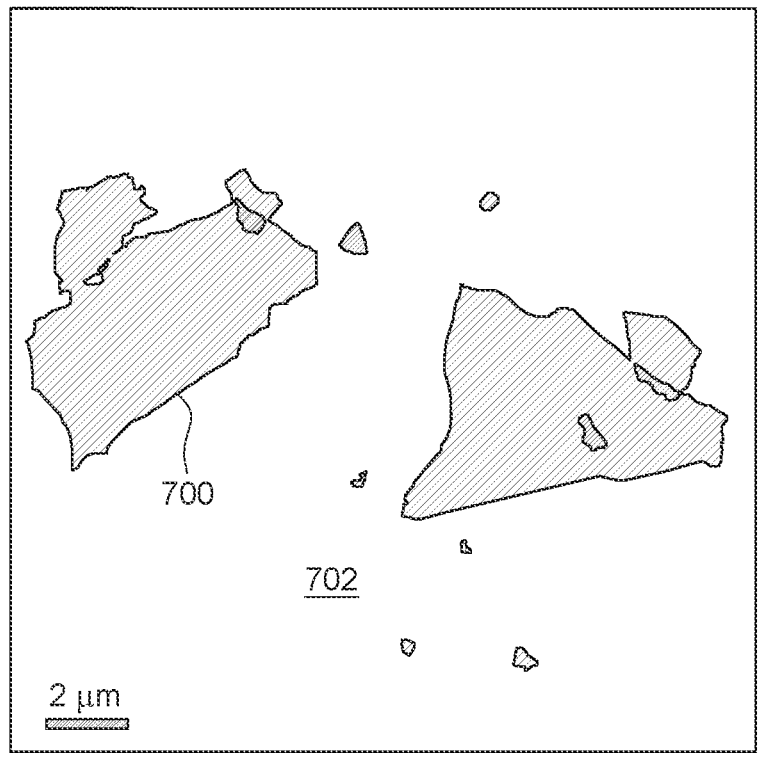
Figure 7C:
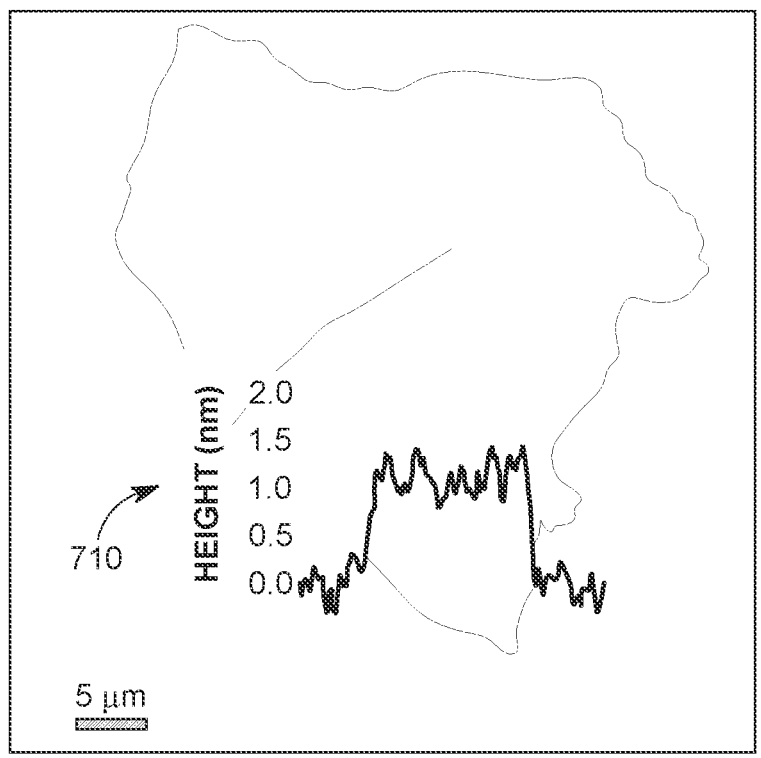
Figure 7D:
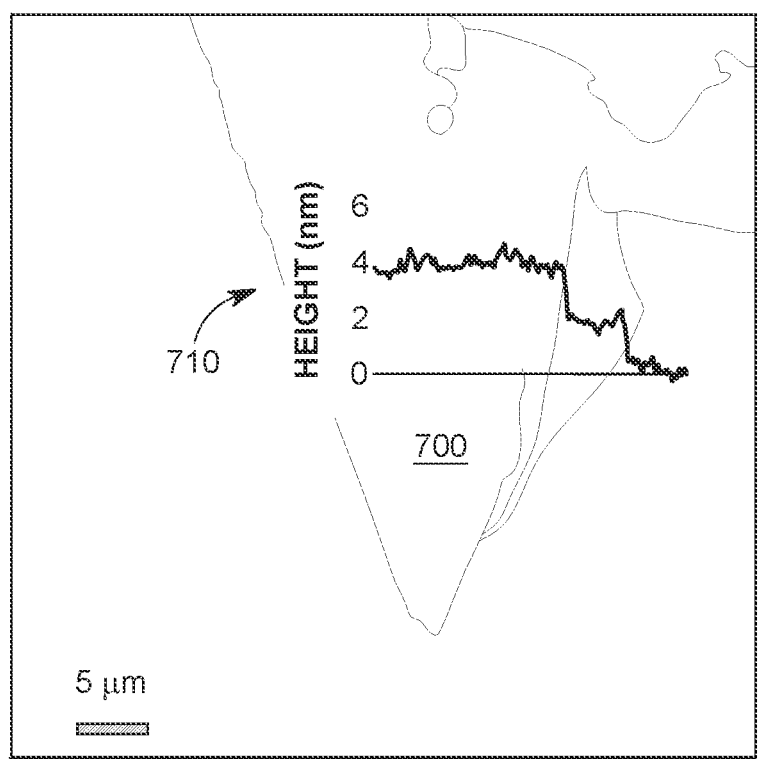

To confirm the successful preparation of the flat GO flakes 700, FIGS. 7A to 7D illustrate the morphology and dimensions of the exfoliated graphene flakes 700. FIGS. 7A and 7B are rendering illustrations of the GO flakes, extracted from experimental atomic force microscopy (AFM) images and after being drop-casted to a piece of silicon wafer 702. FIGS. 7C and 7D show magnified AFM views of two representative GO flakes 700, along with their associated thickness (height) profiles 710. Note that the thickness profiles of the GO flakes 700, as represented in FIGS. 7C and 7D, also indicate the presence of a smooth, flat surface for the same, with the height varying not more than 2 nm in FIG. 7C and not more than 4 nm in FIG. 7D.

As mentioned above, it is possible to customize the surface chemistry of the GO flakes. For this, one or more additional steps may be performed. Tailoring the surface chemistry constitutes another novel feature that is enabled by the graphene layer. For classical membrane-based platforms such as those made from silicon nitride or silicon dioxide 200, this option is not available. Customizing the surface of the graphene membrane 508, effectively extends its scope of use, particularly when viewed as a reactive substrate. Here, functionalization of the membrane 508 with amine groups is exemplified, but other types of moiety grafting can be carried out, as one skilled in the art will recognize.

To synthesize amine-functionalized flat GO flakes, 100 mg of GO (prepared as discussed in FIG. 6, steps 600 to 616) was dispersed in 10 mL of deionized water followed by the addition of 300 mg of ethylamine in 10 mL of ethanol, in step 618. Next, the mixture was stirred well for 20 hours, at room temperature. The resulting suspension provided chemically-tailored GO flat flakes 620 that are able to graft species (molecules, particles, etc.) reactive to amine-groups.

Figure 8:
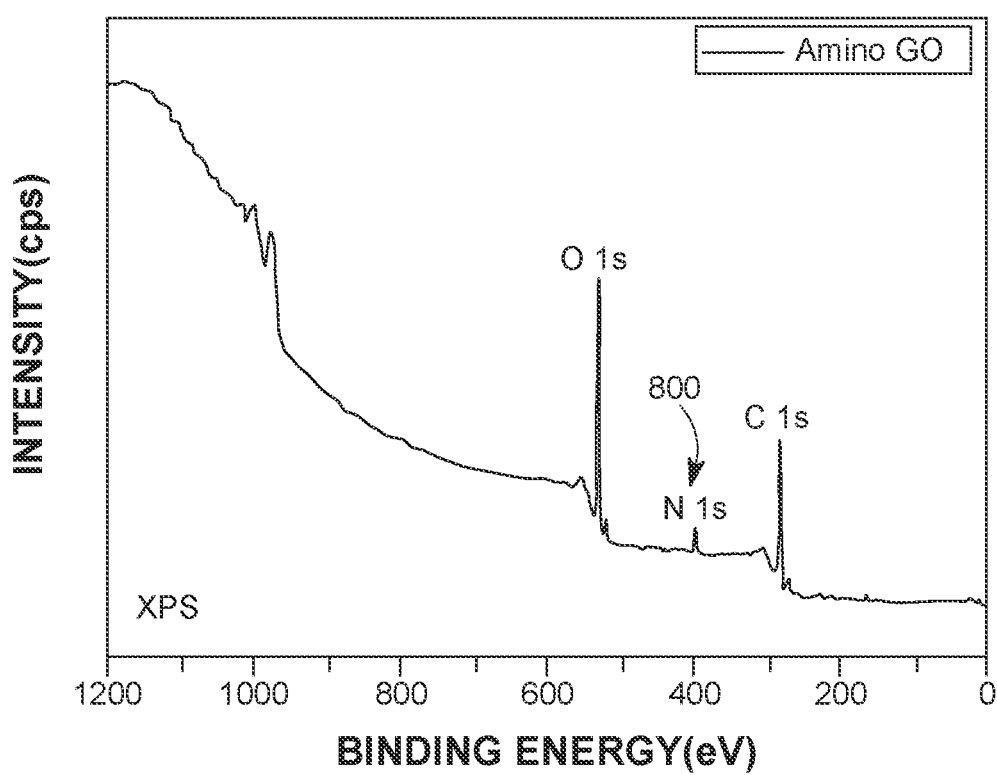
FIG. 8 illustrates tailoring of the surface of flat graphene flakes with the introduction of grafted amino groups, confirmed by the presence of the nitrogen peak in the x-ray photoelectron spectrum.

To confirm the successful preparation of the amine-functionalized flat graphene flakes 620, FIG. 8 shows the X-ray photoelectron spectrum of the flakes 620, where the N peak 800 refers to the presence of the amine groups. It is not the scope of this disclosure to show aspects of the use of these tailored GO flakes, but one skilled in the art will recognize its impact for various scientific and technological purposes such as in the surface-immobilization of biomolecules and in heterogeneous catalysis.

Figure 9:
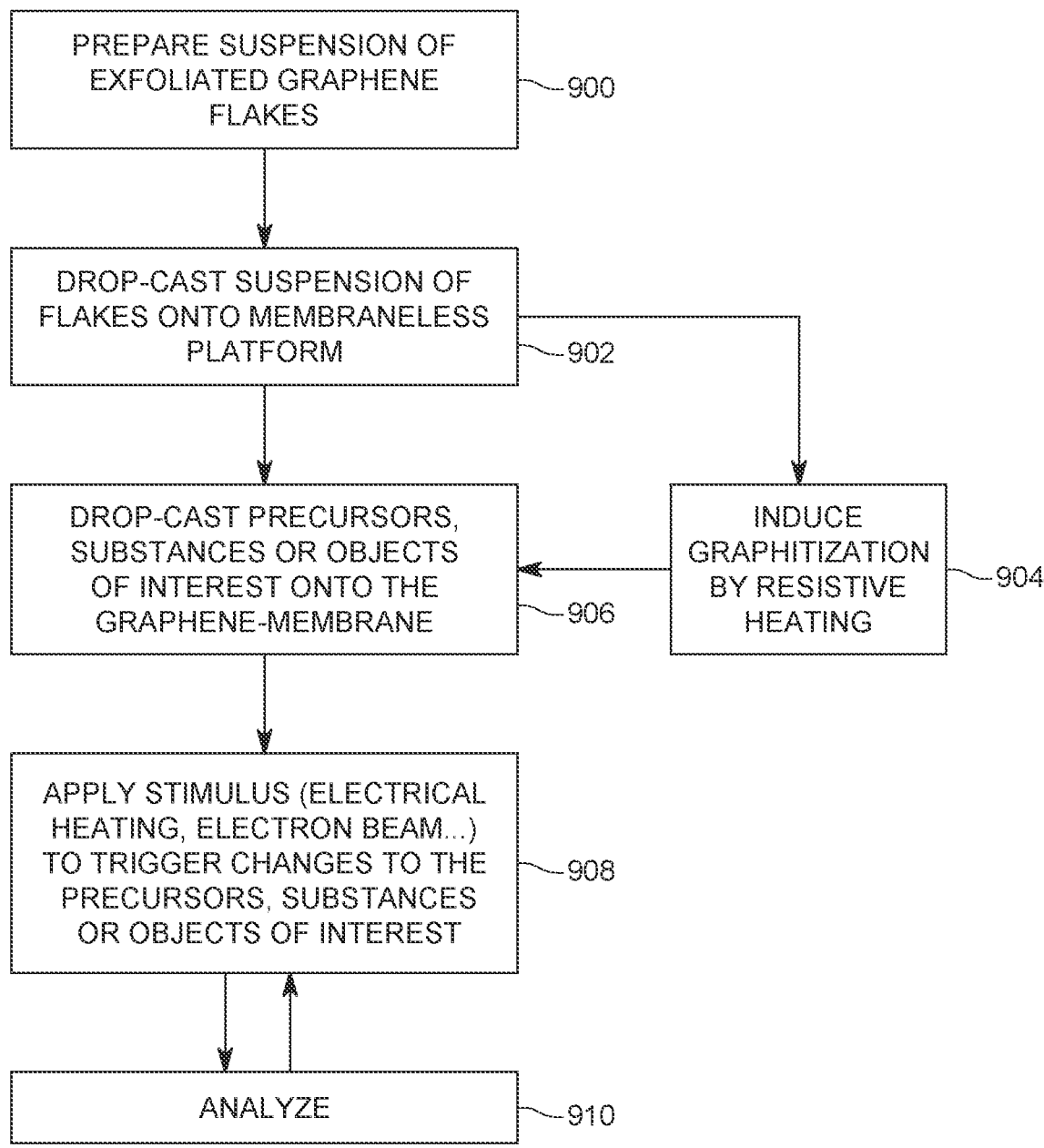
FIG. 9 is a flowchart of a general method to prepare a diced sample platform containing an exfoliated graphene membrane, followed by the use of the same platform for the study of a target material by heating or chemical processing.

A method of adding the exfoliated graphene membrane 508 to the sample platform 500, as shown in FIG. 5, is now discussed with regard to FIG. 9. In one embodiment, the graphene membrane 508 integrates with the sample platform 500 that is taken into a TEM holder for analysis in this microscopical investigating apparatus. In such case, a suspension of graphene flakes 700 is prepared in step 900 (for example, as discussed above with regard to FIG. 6). A fraction of this liquid suspension is drop-cast in step 902 over the slot 506 to form the graphene-based membrane 508, which will be in direct contact with the metallic electrodes 510. To upload the membrane 508, the first step 900 generates a liquid where the exfoliated graphene flakes are present in a given concentration. In the example discussed, this was between 0.1 and 10 μg/ml, with a preferred concentration of 0.5 μg/ml. One skilled in the art will understand that these numbers are merely illustrative, and other concentrations may apply to samples with different flake dimensions and/or surface chemistry. In step 902, the drop-casting process is applied to deliver the exfoliated graphene flakes 700 on top of the slot 506, and thus, form the suspended exfoliated graphene membrane 508. In its simplest (and possibly less expensive) iteration, the drop-casting process may involve a pipette to deliver the exfoliated graphene flakes 700 present in the suspension. Other methods can be used to deliver the flakes 700 from liquid mixtures or position them over the slot 508 with a higher precision (e.g., by employing nanomanipulators).

The inventors have found that the flat and thin exfoliated graphene flakes 700, when deposited as an exfoliated graphene membrane 508 over the electrodes 510 and slot 506 of an existing platform 500, are structurally and mechanically stable to the point of allowing the acquisition of crystal lattice resolved images in a TEM. Note that, for use in the TEM, the exfoliated graphene membranes that are deposited over the slot 506 cannot be made of any exfoliated graphene material (as defined above), but only from those flakes that are flatter and thinner such as the ones illustrated in FIGS. 7C to 7D. If these qualities are not present, the TEM image of the studied material would be distorted. The term "thin" for use in TEM is defined to characterize an exfoliated graphene membrane that has a thickness of not more than 100 nm. In one preferred embodiment, the thickness is less than 10 nm. The term "flat" in this application is defined to characterize an exfoliated graphene membrane that has a height profile that varies not more than 20 nm. In one embodiment, the height profile varies not more than 2 nm. In one application, the exfoliated graphene membrane has a thickness of less than 5 nm and a height profile that is less than 2 nm.

After drop-casting the graphene flakes 700 onto the sample platform 500, it is necessary, in one application, to ensure that there is only one flake 700 suspended across the slot 506. To evaluate this, one needs to examine the platform 500 with a microscope. If more than one flake is suspended, an evaluation of which has the best conditions to enable the subsequent experiments should be carried out. Parameters to consider include the size and thickness of the flake, how well structured the lattice and the edges are, how well connected is the flake to the electrodes of the platform, etc. Once this selection is done, the redundant flakes are cut or displaced. In one embodiment, this elimination process can be realized through the beam of an electron microscope or the tip of a nanomanipulator.

Following the above steps, the graphene-based membrane 508 is suspended across the through-hole 506 of the platform 500 and is in electrical contact with, at least, two electrodes 510. The method of adding the membrane to the platform may include an optional and subsequent step to modify the suspended graphene membrane. Besides the functionalization step described above (done previous to the membrane placing step), a post-placement process step may be performed on the suspended graphene flake. This will depend on the intended function of the membrane and is exemplified by physical and/or chemical modifications such as: 1) coating the graphene membrane with another material (e.g., via atomic layer deposition), 2) subjecting the membrane to a flow of a reactive gas at varied temperatures (e.g., flow of hydrogen inside an environmental TEM or simply in a benchtop reactor), 3) applying an electrical current through the graphene membrane to reduce (or entirely eliminate) the amount of non-carbon atoms as well as restructure the graphene lattice, etc. In one embodiment, the application of an electrical current results in self-heating of the membrane (via the Joule heating effect). In the presence of a non-oxidizing atmosphere, this reduces/eliminates the amount of oxygen present in the suspended GO flake and re-structures the graphene lattice. Such a modification also improves the electrical conductivity of the membrane.

Figure 10:
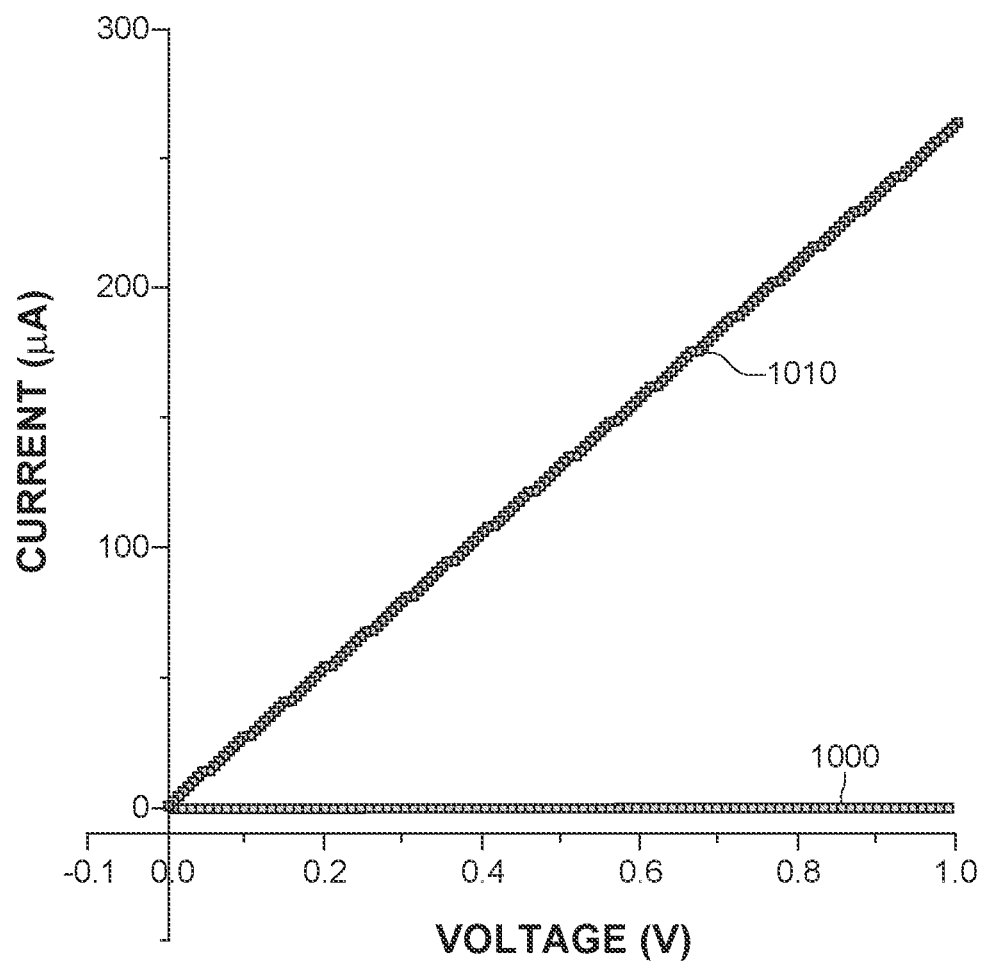
FIG. 10 illustrates how the current-voltage relation of the graphene-based membrane changes after a heat treatment.

For example, FIG. 10 shows the current (y axis) that passes through an exfoliated graphene membrane 508 when a voltage (x axis) is applied to the two electrodes 510 (that are in contact with the same membrane 508), before the reduction process (curve 1000) and after the electrically-induced reduction process (curve 1010). Here, the current applied to the exfoliated graphene membrane 508 to undertake the reduction process was in the order of 1 mA. One skilled in the art will understand that this current varies from flake to flake.

From FIG. 10, it is observed that before the reduction process step, the exfoliated graphene membrane 508 had a high and constant resistance in the voltage window of 0.0-1.0 V. However, after the reduction, the same membrane 508 behaved like an Ohmic resistor, i.e., its current was directly proportional to the applied voltage. Note that a direct or alternating current can be applied to the electrodes 510 to reduce the exfoliated graphene membrane 508. Likewise, for any other process undertaken on the membrane 508 that relies on electrical currents, direct or alternating types can be used. As mentioned, note that a reduced GO membrane is understood herein to be a GO membrane that shows a reduced number of oxygen atoms (or other non-carbon atoms) or, ultimately their absence, when compared with a traditional GO membrane. One skilled in the art of carbon materials will recognize these phenomena as resultant of the carbonization and graphitization steps that are characteristic of carbon allotropes processing. In fact, the reduced GO membrane (RGO) can attain a high degree of graphitization if electrical heating is performed under high vacuum or inert gas atmosphere, as in step 904. Due to its thermal profile, the electrical heating will not compromise the other components of the platform (e.g., the electrodes 510).

As mentioned above, the graphene membrane 508 can be processed to clean its surface with the intention of re-using it. After an experiment, if remainders are left supported on the membrane, electrical heating may be used to sublime these (provided the temperature of sublimation is below 3,000° C., in a non-oxidizing atmosphere, and there is no chemical interaction with the supporting carbon lattice). Other methods may also work such as dipping the platform into a reactive solution (e.g. diluted acid). Tests have shown that the graphene membrane 508 is mechanically stable to the point of withstanding the surface tension of a range of solvents. One skilled in the art will recognize that other physical and chemical processes exist that can work towards this same end. If a new membrane is required (e.g., the one used is too contaminated or damaged beyond repair), it is possible to remove the used membrane and load another one in its place, on the same supporting platform 500. Processes to do so include those already described above for the uploading and selection of the flakes 700.

The exfoliated graphene membrane 508 is a versatile support that can either be a passive or active substrate towards particles or chemical precursors deposited on it. In one embodiment, minute amounts of the substances (reaction precursors or objects such as nanoparticles) can be drop-casted in step 906 as a solution or dispersion onto the graphene membrane 508. Modifications to these substances (whether physical or chemical) are activated in step 908 using, for instance, controlled resistive heating of the graphene membrane (or any stimulus or combination of stimuli). After activating the modification process (physical or chemical), the substances or objects of interest are analyzed in step 910. Upon finalizing the characterization, additional modifications 908 may be attempted followed by a new assessment 910, thereby perpetuating a cycle of processing and analysis of the same object of interest.

In the following, two applications of the sample platform 500, where the graphene membrane 508 is used as a support, are described. These are examples of how the present invention can be used and do not exclude any other applications. In both cases presented, the TEM was employed as the investigating tool, but other tools could have been resorted to.

Figure 11A:
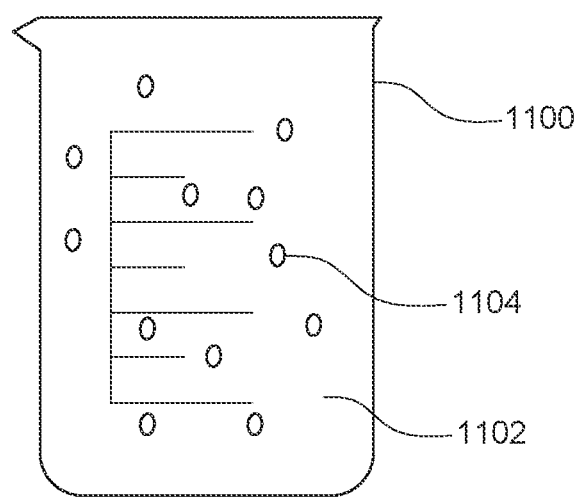
FIG. 11A illustrates a solution of precursors or suspension of nanoparticles to be added to an exfoliated graphene membrane.
Figure 11B:
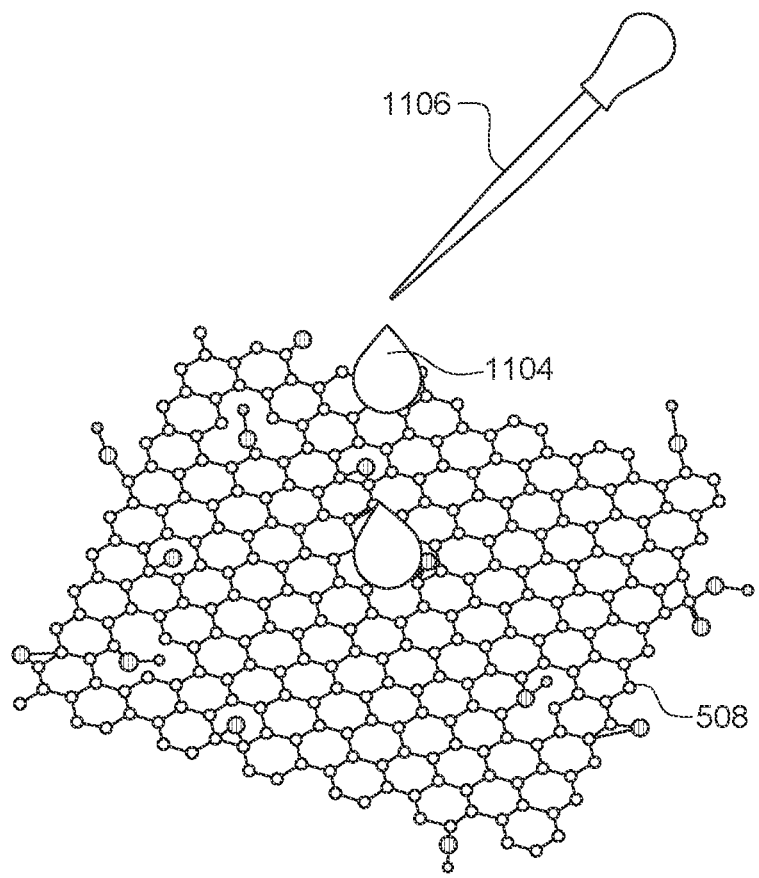
FIG. 11B illustrates a drop-casting of the precursors or nanoparticles onto the exfoliated graphene membrane.

The first application is related to a physical process which is the structural changes a nanoparticle undergoes as it is exposed to heat. As previously mentioned, the graphene membrane 508 is structurally stable up to 3,000° C. in vacuum. Such a temperature can be attained by electrically heating the graphene, but there is no way to easily measure it inside an investigating apparatus such as the TEM. Thus, to demonstrate the high temperatures attained, a study of the melting and evaporation of $SiO_2$ nanoparticles, commercially available under the tradename KCC-1, was carried out in the high vacuum atmosphere of a TEM. These nanoparticles are known to have a melting point in the region of 1,500° C., which is well above the maximum temperature currently attained with existing platforms for TEM based on Si-membranes. The $SiO_2$ nanoparticles 1104 were dispersed in a liquid 1102 present in a container 1100, as illustrated in FIG. 11A. Then, this dispersion containing the nanoparticles 1104 was drop-casted, using a pipette 1106, as illustrated in FIG. 11B, onto the exfoliated graphene membrane 508 that had been previously integrated into the platform 500. The platform 500 was then placed in the TEM holder 100 wherein the contact between these two parts was established via the pads of the electrodes 510. The temperature of the exfoliated graphene membrane 508 was steadily increased by injecting current into it. Given the stability of the membrane 508, it was possible to image continuously the same area, that contained dozens of the spherical nanoparticles 1104, throughout the heating process. In the first stage, the nanoparticles 1104 closer to the center of the membrane reoriented and melted. As these physical modifications took place, fusing of neighboring particles occurred. As the current density flowing through the membrane increased, so did the temperature on it, and more particles melted and merged that were placed closer to the edge of the membrane 508. Simultaneously, the other particles at the center of the membrane started to evaporate. The continued exposure to increasing temperature led to the almost complete evaporation of the entire set of the nanoparticles, bar some that were closer to the edges of the membrane (due to the heat-sink effect of the electrodes).

These observations imply that most of the membrane 508 attained a temperature well in excess of the melting point of the $SiO_2$ particles 1104. Note that the TEM apparatus enabled the recording, in real time, of the evolution of the $SiO_2$ particles 1104. Also, the same experiment was attempted in a benchtop furnace with a maximum working temperature of 1,200° C. and in a medium vacuum environment. After imaging the graphene membrane 508, the nanoparticles had not started to merge. This application shows both the superior temperature attained during the resistive heating and the stability (thermal, structural and mechanical) of the graphene membrane 508.

Figure 12:
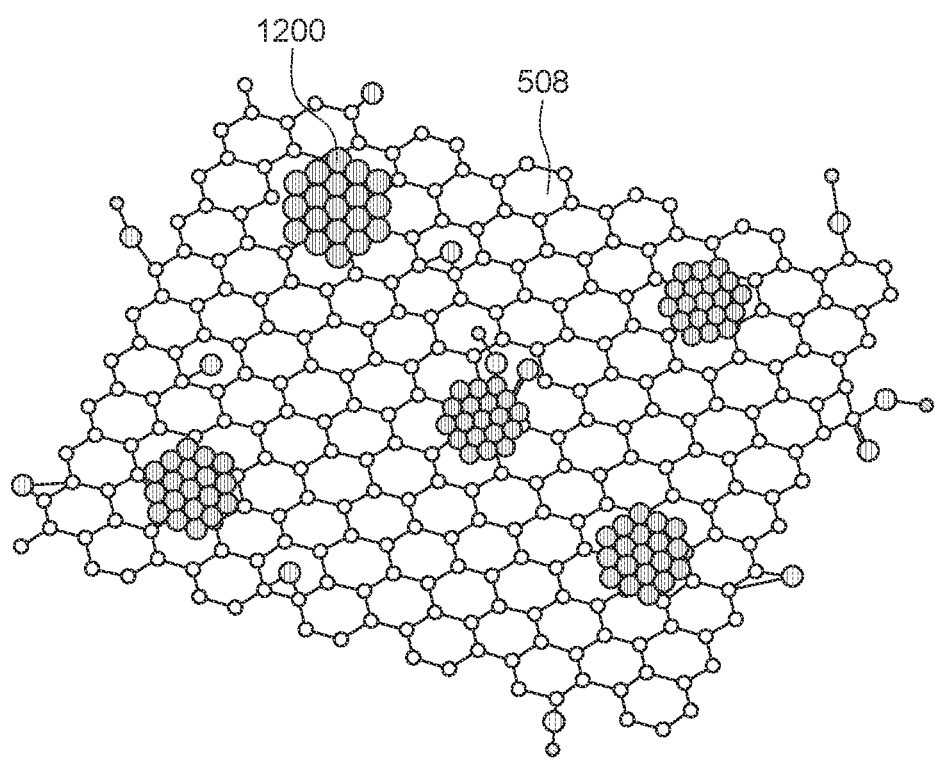
FIG. 12 illustrates the use of the same platform for chemical processing.

The second application is related to a chemical process which is the direct nucleation and synthesis of gold nanoparticles using the graphene membrane 508 as a support. The process occurring inside a TEM apparatus is described in regards to FIG. 12. Similar to FIG. 11A, a container 1100 that has a solution of the chemical precursor which is used to synthesize the Au nanoparticles. As per FIG. 11B, the solution is drop-casted onto the graphene membrane 508, using, for example, a pipette 1106. After the liquid dries, the chemical precursor remains on the surface of the membrane 508. The platform 500 containing this membrane 508 is placed in the TEM holder 100 and taken into the investigating apparatus. As the electron beam interacts with the precursor-loaded membrane and the electrical current flowing through the membrane is increased, the Au nanoparticles 1200 are seen to nucleate and grow, a phenomenon illustrated in FIG. 12. The process kinetics can be altered depending on the current density provided to the membrane 508. Again, the graphene membrane 508 remained stable throughout the procedure, enabling the real-time recording of the same area inside the TEM apparatus.

An expert will recognize that the above described experiments or applications are merely illustrative of the potential of these membranes 508 and many other reactions (chemical) and processes (physical) can be designed, particularly when considering the possibility of surface tailoring.

Figure 13:
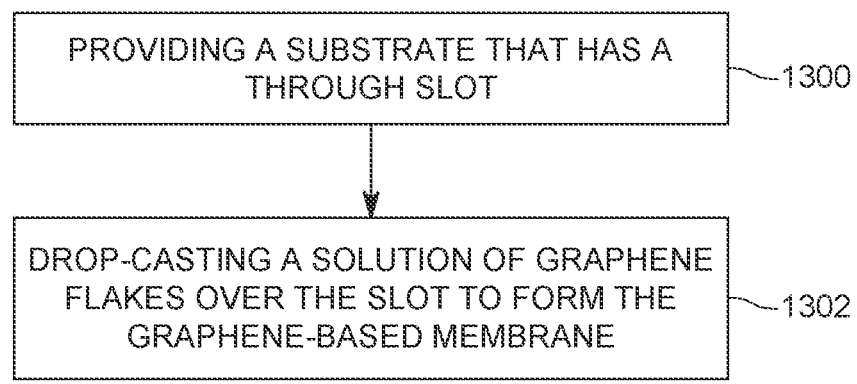
FIG. 13 is a flowchart of a method for forming a graphene-based membrane on a sample platform.

A method of adding a graphene-based membrane 508 to a multipurpose sample platform 500 or 1200, for a transmission electron microscope or any other investigative tool, for supporting a target material is now discussed with regard to FIG. 13. The method includes a step 1300 of providing a substrate 502 that has a through slot 506, and a step 1302 of drop-casting a solution of graphene flakes 700 over the slot 506 to form the graphene-based membrane 508. The graphene-based membrane 508 is in electrical contact with at least one electrode 510. The method may further include a step of forming a dielectric layer 504 over a face of the substrate 502, and a step of forming the electrode 510 over the dielectric layer 504. The method may further include a step of forming the graphene flakes 700 to include oxygen atoms or other desired atoms or moieties, and/or a step of applying a current through the graphene-based membrane to reduce an amount of oxygen atoms or other atoms, and/or a step of continuing to apply the current through the graphene-based membrane to have no oxygen or other atoms. In one application, the graphene-based membrane has a thickness of less than 100 nm. In another application, the graphene-based membrane has a thickness of less than 5 nm. In still another application, the graphene-based membrane has a roughness of less than 10 nm. In yet another application, the graphene-based membrane has a roughness of less than 2 nm. In one application, the graphene-based membrane has a thickness of less than 5 nm and a roughness of less than 2 nm. In one embodiment, no component of the platform includes silicon nitride.

The disclosed embodiments provide methods and systems for studying materials under various conditions and within an imaging apparatus using the same sample platform that contains an exfoliated graphene membrane. It should be understood that the above description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A multipurpose and transferrable sample platform for supporting, analyzing and/or processing a target material, the platform comprising:
   a substrate;
   a dielectric layer formed over a face of the substrate;
   electrodes formed over the dielectric layer;
   a slot formed through the substrate and the dielectric layer; and an exfoliated graphene-based membrane placed over the slot and in electrical contact with the electrodes, wherein the exfoliated graphene-based membrane is configured to support, or act upon, a study material or chemical precursors.

2. The platform of claim 1, wherein the platform is configured to fit in an electron microscope.

3. The platform of claim 1, wherein the platform is transferable between an electron microscope and another investigating tool.

4. The platform of claim 1, wherein the platform is transferable between different investigating tools other than electron microscopes.

5. The platform of claim 1, wherein no component of the platform includes a Si-based membrane.

6. The platform of claim 1, wherein the exfoliated graphene-based membrane includes a single flake of a layered carbon or carbon-based material.

7. The platform of claim 1, wherein the exfoliated graphene-based membrane includes other atoms than carbon, either physically or chemically bonded to the exfoliated graphene-based membrane.

8. The platform of claim 1, wherein the exfoliated graphene-based membrane is modified to sustain or include chemical precursors, nanoparticles or any other objects of interest.

9. The platform of claim 1, wherein the exfoliated graphene-based membrane is configured to include predetermined chemically reactive moieties that are active towards specific chemical bond-making processes.

10. The platform of claim 1, wherein the exfoliated graphene-based membrane is modified to eliminate, partially or entirely, atoms that are not carbon.

11. The platform of claim 1, wherein the exfoliated graphene-based membrane is modified to eliminate, partially or entirely, substances or objects of interest placed on the membrane.

12. The platform of claim 1, wherein the exfoliated graphene-based membrane has an average thickness of less than 1 μm.

13. The platform of claim 1, wherein the exfoliated graphene-based membrane has a surface roughness of less than 10% of its average thickness.

14. The platform of claim 1, wherein the exfoliated graphene-based membrane has an average thickness of less than 100 nm for use in a transmission electron microscope.

15. The platform of claim 1, wherein the exfoliated graphene-based membrane has an average surface roughness of less than 10 nm for use in a transmission electron microscope.

16. The platform of claim 1, wherein the exfoliated graphene-based membrane has an average thickness of less than 5 nm and an average roughness of less than 2 nm for high resolution microscopical analysis.

17. A method of adding an exfoliated graphene-based membrane to a multipurpose and transferrable sample platform for an investigating apparatus for supporting, analyzing and/or processing a target material, the method comprising:

providing a substrate that has a through slot; and drop-casting a liquid containing exfoliated graphene flakes over the slot to form the exfoliated graphene-based membrane, wherein the exfoliated graphene-based membrane is in electrical contact with at least one electrode.

18. The method of claim 17, further comprising:

isolating a single, individual flake from the exfoliated graphene flakes to form the exfoliated graphene-based membrane.

19. The method of claim 17, further comprising:

loading particles, functional groups and other substances, by physical or chemical means, on the exfoliated graphene-based membrane.

20. The method of claim 17, further comprising:

modifying thin, flat flakes of the exfoliated graphene flakes to include functional moieties to be used as reaction centers for chemical bonding purposes.

* * * * *